United States Patent
Nagashima

(10) Patent No.: US 8,308,915 B2
(45) Date of Patent: Nov. 13, 2012

(54) SYSTEMS AND METHODS FOR MAGNETRON DEPOSITION

(75) Inventor: Makoto Nagashima, Tokyo (JP)

(73) Assignee: 4D-S Pty Ltd., Perth (AU)

( * ) Notice: Subject to any disclaimer, the term of this patent is extended or adjusted under 35 U.S.C. 154(b) by 550 days.

(21) Appl. No.: 11/522,081

(22) Filed: Sep. 14, 2006

(65) Prior Publication Data

US 2008/0067063 A1  Mar. 20, 2008

(51) Int. Cl.
*C23C 14/34* (2006.01)

(52) U.S. Cl. ......... 204/192.12; 204/298.26; 204/298.12; 204/298.23; 204/298.25

(58) Field of Classification Search ............. 204/298.12, 204/298.26, 192.12, 298.23, 298.25
See application file for complete search history.

(56) References Cited

U.S. PATENT DOCUMENTS

| | | | |
|---|---|---|---|
| 3,992,202 A * | 11/1976 | Dulis et al. ................ 419/5 |
| 4,260,582 A * | 4/1981 | Kumar et al. ................ 419/48 |
| 4,401,546 A | 8/1983 | Nakamura et al. |
| 4,407,894 A | 10/1983 | Kadokura et al. |
| 4,492,620 A | 1/1985 | Matsuo et al. |
| 4,664,935 A | 5/1987 | Strahl |
| 4,842,708 A | 6/1989 | Kadokura et al. |
| 4,851,095 A | 7/1989 | Scobey |
| 4,880,515 A | 11/1989 | Yoshikawa |
| 4,911,814 A | 3/1990 | Matsuoka et al. |
| 5,000,834 A | 3/1991 | Yoshikawa |
| 5,122,252 A | 6/1992 | Latz |
| 5,135,629 A | 8/1992 | Sawada |
| 5,178,739 A | 1/1993 | Barnes et al. |
| 5,181,020 A * | 1/1993 | Furukawa et al. ............ 340/551 |
| 5,186,718 A | 2/1993 | Tepman et al. |
| 5,196,105 A | 3/1993 | Feuerstein et al. |
| 5,286,296 A | 2/1994 | Sato |
| 5,317,006 A * | 5/1994 | Kumar .................... 204/298.12 |
| 5,334,302 A | 8/1994 | Kubo |
| 5,344,352 A | 9/1994 | Horne |
| 5,354,443 A | 10/1994 | Moslehi |
| 5,415,754 A | 5/1995 | Manley |
| 5,555,486 A | 9/1996 | Kingon et al. |
| 5,718,812 A | 2/1998 | Takaoka |
| 5,783,295 A | 7/1998 | Barnett et al. |
| 5,968,327 A * | 10/1999 | Kobayashi et al. ......... 204/298.11 |
| 6,036,824 A | 3/2000 | Hedgcoth |
| 6,077,406 A | 6/2000 | Kawakubo |
| 6,143,140 A | 11/2000 | Wang et al. |
| 6,156,172 A | 12/2000 | Kadokura |
| 6,204,139 B1 | 3/2001 | Liu |
| 6,217,714 B1 | 4/2001 | Nishihara et al. |
| 6,251,242 B1 * | 6/2001 | Fu et al. .................. 204/298.19 |
| 6,290,826 B1 | 9/2001 | Obinata et al. |
| 6,342,133 B2 | 1/2002 | D'Couto |
| 6,373,194 B1 | 4/2002 | Small |

(Continued)

FOREIGN PATENT DOCUMENTS

JP   57158380   9/1982

(Continued)

*Primary Examiner* — Keith Hendricks
*Assistant Examiner* — Jason M Berman
(74) *Attorney, Agent, or Firm* — Sawyer Law Group, P.C.

(57) ABSTRACT

Systems and methods are disclosed for face target sputtering to fabricate semiconductors by providing one or more materials with differential coefficients of expansion in the FTS chamber; and generating a controlled pressure and size with the one or more materials during sintering.

19 Claims, 10 Drawing Sheets

U.S. PATENT DOCUMENTS

| | | |
|---|---|---|
| 6,402,903 B1 | 6/2002 | Jiang et al. |
| 6,444,100 B1 | 9/2002 | McLeod |
| 6,473,332 B1 | 10/2002 | Ignatiev |
| 6,482,329 B1 | 11/2002 | Takahashi |
| 6,497,796 B1 | 12/2002 | Ashtiani |
| 6,531,371 B2 | 3/2003 | Hsu |
| 6,569,745 B2 | 5/2003 | Hsu |
| 6,583,003 B1 | 6/2003 | Hsu |
| 6,641,702 B2 | 11/2003 | Shi |
| 6,654,210 B2 | 11/2003 | Pan |
| 6,664,117 B2 | 12/2003 | Zhuang |
| 6,673,691 B2 | 1/2004 | Zhuang |
| 6,689,253 B1 * | 2/2004 | Koh et al. ............ 204/192.12 |
| 6,693,821 B2 | 2/2004 | Hsu |
| 6,723,643 B1 | 4/2004 | Pan |
| 6,746,910 B2 | 6/2004 | Hsu |
| 6,753,561 B1 | 6/2004 | Rinerson et al. |
| 6,759,249 B2 | 7/2004 | Zhuang |
| 6,762,481 B2 | 7/2004 | Liu |
| 6,774,004 B1 | 8/2004 | Hsu |
| 6,774,054 B1 | 8/2004 | Zhang |
| 6,787,010 B2 | 9/2004 | Cuomo et al. |
| 6,798,685 B2 | 9/2004 | Rinerson |
| 6,801,448 B2 | 10/2004 | Hsu |
| 6,824,814 B2 | 11/2004 | Zhuang |
| 6,825,058 B2 | 11/2004 | Hsu |
| 6,831,854 B2 | 12/2004 | Rinerson |
| 6,834,008 B2 | 12/2004 | Rinerson |
| 6,836,421 B2 | 12/2004 | Rinerson |
| 6,837,975 B2 | 1/2005 | Wang et al. |
| 6,841,833 B2 | 1/2005 | Hsu |
| 6,849,564 B2 | 2/2005 | Hsu |
| 6,849,891 B1 | 2/2005 | Hsu |
| 6,850,429 B2 | 2/2005 | Rinerson |
| 6,850,455 B2 | 2/2005 | Rinerson |
| 6,856,536 B2 | 2/2005 | Rinerson et al. |
| 6,858,905 B2 | 2/2005 | Hsu |
| 6,859,382 B2 | 2/2005 | Rinerson |
| 6,861,687 B2 | 3/2005 | Hsu |
| 6,868,025 B2 | 3/2005 | Hsu |
| 6,870,755 B2 | 3/2005 | Rinerson |
| 6,875,651 B2 | 4/2005 | Hsu |
| 6,876,521 B2 | 4/2005 | Pan |
| 6,881,311 B2 | 4/2005 | Kadokura et al. |
| 6,887,523 B2 | 5/2005 | Zhuang |
| 6,899,795 B1 | 5/2005 | Dubs |
| 6,905,937 B2 | 6/2005 | Hsu |
| 6,906,939 B2 | 6/2005 | Rinerson |
| 6,909,632 B2 | 6/2005 | Rinerson |
| 6,911,123 B2 | 6/2005 | Kadokura |
| 6,911,361 B2 | 6/2005 | Zhang et al. |
| 6,917,539 B2 | 7/2005 | Rinerson |
| 6,925,001 B2 | 8/2005 | Hsu |
| 6,927,120 B2 | 8/2005 | Hsu |
| 6,927,430 B2 | 8/2005 | Hsu |
| 6,939,724 B2 | 9/2005 | Zhuang |
| 6,940,113 B2 | 9/2005 | Hsu |
| 6,940,744 B2 | 9/2005 | Rinerson et al. |
| 6,949,435 B2 | 9/2005 | Hsu |
| 6,955,992 B2 | 10/2005 | Zhang |
| 6,956,280 B2 | 10/2005 | Tajiri |
| 6,962,648 B2 | 11/2005 | Nagashima et al. |
| 6,965,137 B2 | 11/2005 | Kinney |
| 6,967,884 B2 | 11/2005 | Hsu |
| 6,970,375 B2 | 11/2005 | Rinerson |
| 6,972,211 B2 | 12/2005 | Hsu |
| 6,972,238 B2 | 12/2005 | Hsu |
| 6,972,239 B1 | 12/2005 | Li |
| 6,972,985 B2 | 12/2005 | Rinerson |
| 6,974,771 B2 | 12/2005 | Chen et al. |
| 6,985,376 B2 | 1/2006 | Matsuoka |
| 6,992,920 B2 | 1/2006 | Tamai |
| 6,992,922 B2 | 1/2006 | Rinerson |
| 6,995,999 B2 | 2/2006 | Morimoto |
| 6,998,698 B2 | 2/2006 | Inoue |
| 7,001,846 B2 | 2/2006 | Hsu |
| 7,009,235 B2 | 3/2006 | Rinerson |
| 7,009,909 B2 | 3/2006 | Rinerson |
| 7,016,094 B2 | 3/2006 | Awaya |
| 7,016,222 B2 | 3/2006 | Morikawa |
| 7,020,006 B2 | 3/2006 | Chevallier |
| 7,020,012 B2 | 3/2006 | Rinerson |
| 7,027,322 B2 | 4/2006 | Suzuki |
| 7,027,342 B2 | 4/2006 | Inoue |
| 7,029,924 B2 | 4/2006 | Hsu |
| 7,029,982 B1 | 4/2006 | Zhuang |
| 7,038,935 B2 | 5/2006 | Rinerson |
| 7,042,035 B2 | 5/2006 | Rinerson |
| 7,042,066 B2 | 5/2006 | Hsu |
| 7,045,840 B2 | 5/2006 | Tamai |
| 7,054,183 B2 | 5/2006 | Rinerson |
| 7,057,914 B2 | 6/2006 | Rinerson et al. |
| 7,057,922 B2 | 6/2006 | Fukumoto |
| 7,060,586 B2 | 6/2006 | Li et al. |
| 7,063,984 B2 | 6/2006 | Nagashima et al. |
| 7,067,862 B2 | 6/2006 | Rinerson |
| 7,071,008 B2 | 7/2006 | Rinerson |
| 7,075,817 B2 | 7/2006 | Rinerson |
| 7,079,442 B2 | 7/2006 | Rinerson et al. |
| 7,082,052 B2 | 7/2006 | Rinerson |
| 7,084,691 B2 | 8/2006 | Hsu |
| 7,095,643 B2 | 8/2006 | Rinerson |
| 7,095,644 B2 | 8/2006 | Chevallier |
| 7,098,043 B2 | 8/2006 | Zhuang |
| 7,098,101 B1 | 8/2006 | Li |
| 7,099,179 B2 | 8/2006 | Rinerson |
| 7,106,120 B1 | 9/2006 | Hsu |
| 2001/0013470 A1 | 8/2001 | Hirata |
| 2002/0023832 A1 | 2/2002 | Hong |
| 2002/0074225 A1 | 6/2002 | Shi |
| 2003/0001178 A1 | 1/2003 | Hsu |
| 2003/0003674 A1 | 1/2003 | Hsu |
| 2003/0003675 A1 | 1/2003 | Hsu |
| 2003/0142578 A1 | 7/2003 | Hsu |
| 2003/0148545 A1 | 8/2003 | Zhuang |
| 2003/0148546 A1 | 8/2003 | Zhang |
| 2003/0156445 A1 | 8/2003 | Zhuang |
| 2003/0197587 A1 | 10/2003 | Pan |
| 2003/0203585 A1 | 10/2003 | Hsu |
| 2003/0206481 A1 | 11/2003 | Hsu |
| 2003/0219534 A1 | 11/2003 | Zhuang |
| 2004/0036109 A1 | 2/2004 | Inoue |
| 2004/0061160 A1 | 4/2004 | Kumagai |
| 2004/0063274 A1 | 4/2004 | Hsu |
| 2004/0095689 A1 | 5/2004 | Pan |
| 2004/0095805 A1 | 5/2004 | Matsuoka |
| 2004/0100814 A1 | 5/2004 | Hsu |
| 2004/0108528 A1 | 6/2004 | Hsu |
| 2004/0121074 A1 | 6/2004 | Zhuang |
| 2004/0130939 A1 | 7/2004 | Morikawa |
| 2004/0147081 A1 | 7/2004 | Hsu |
| 2004/0159828 A1 | 8/2004 | Rinerson |
| 2004/0159867 A1 | 8/2004 | Kinney |
| 2004/0159869 A1 | 8/2004 | Rinerson |
| 2004/0160796 A1 | 8/2004 | Johnson |
| 2004/0160804 A1 | 8/2004 | Rinerson |
| 2004/0160805 A1 | 8/2004 | Rinerson |
| 2004/0160806 A1 | 8/2004 | Rinerson |
| 2004/0160807 A1 | 8/2004 | Rinerson |
| 2004/0160808 A1 | 8/2004 | Rinerson |
| 2004/0160812 A1 | 8/2004 | Rinerson |
| 2004/0160817 A1 | 8/2004 | Rinerson |
| 2004/0160818 A1 | 8/2004 | Rinerson |
| 2004/0160819 A1 | 8/2004 | Rinerson |
| 2004/0161888 A1 | 8/2004 | Rinerson |
| 2004/0164332 A1 | 8/2004 | Hsu |
| 2004/0170040 A1 | 9/2004 | Rinerson |
| 2004/0170048 A1 | 9/2004 | Hsu |
| 2004/0170761 A1 | 9/2004 | Li |
| 2004/0171215 A1 | 9/2004 | Hsu |
| 2004/0179414 A1 | 9/2004 | Hsu |
| 2004/0180507 A1 | 9/2004 | Zhang |
| 2004/0202041 A1 | 10/2004 | Hidenori |
| 2004/0228172 A1 | 11/2004 | Rinerson |
| 2004/0235200 A1 | 11/2004 | Hsu |
| 2004/0235247 A1 | 11/2004 | Hsu |
| 2004/0235309 A1 | 11/2004 | Hsu |

| | | |
|---|---|---|
| 2004/0257864 A1 | 12/2004 | Tamai |
| 2004/0264244 A1 | 12/2004 | Morimoto |
| 2005/0009286 A1 | 1/2005 | Hsu |
| 2005/0037520 A1 | 2/2005 | Zhuang |
| 2005/0040482 A1 | 2/2005 | Suzuki |
| 2005/0052942 A1 | 3/2005 | Hsu |
| 2005/0054119 A1 | 3/2005 | Hsu |
| 2005/0054138 A1 | 3/2005 | Hsu |
| 2005/0079727 A1 | 4/2005 | Zhang |
| 2005/0083757 A1 | 4/2005 | Hsu |
| 2005/0101086 A1 | 5/2005 | Rinerson |
| 2005/0111263 A1 | 5/2005 | Rinerson |
| 2005/0122768 A1 | 6/2005 | Fukumoto |
| 2005/0124112 A1 | 6/2005 | Hsu |
| 2005/0127403 A1 | 6/2005 | Hsu |
| 2005/0135147 A1 | 6/2005 | Rinerson |
| 2005/0135148 A1 | 6/2005 | Chevallier |
| 2005/0136602 A1 | 6/2005 | Hsu |
| 2005/0141269 A1 | 6/2005 | Hsu |
| 2005/0145910 A1 | 7/2005 | Tamai |
| 2005/0151277 A1 | 7/2005 | Kawazoe |
| 2005/0152024 A1 | 7/2005 | Awaya |
| 2005/0153504 A1 | 7/2005 | Kawazoe |
| 2005/0158994 A1 | 7/2005 | Zhuang |
| 2005/0169038 A1 | 8/2005 | Inoue |
| 2005/0174835 A1 | 8/2005 | Rinerson |
| 2005/0186334 A1 | 8/2005 | Otabe |
| 2005/0195632 A1 | 9/2005 | Rinerson |
| 2005/0207248 A1 | 9/2005 | Hsu |
| 2005/0207265 A1 | 9/2005 | Hsu |
| 2005/0211546 A1 | 9/2005 | Hanawa et al. |
| 2005/0213368 A1 | 9/2005 | Rinerson |
| 2005/0230724 A1 | 10/2005 | Hsu |
| 2005/0231992 A1 | 10/2005 | Rinerson |
| 2005/0239262 A1 | 10/2005 | Zhuang |
| 2005/0243595 A1 | 11/2005 | Rinerson |
| 2005/0243630 A1 | 11/2005 | Hsu |
| 2005/0245039 A1 | 11/2005 | Li |
| 2005/0255700 A1 | 11/2005 | Gopalraja et al. |
| 2005/0266686 A1 | 12/2005 | Zhuang |
| 2005/0270821 A1 | 12/2005 | Nakano |
| 2005/0275003 A1 | 12/2005 | Shinmura |
| 2005/0275064 A1 | 12/2005 | Li |
| 2005/0276091 A1 | 12/2005 | Inoue |
| 2005/0276138 A1 | 12/2005 | Inoue |
| 2006/0002174 A1 | 1/2006 | Hosoi |
| 2006/0003489 A1 | 1/2006 | Zhang |
| 2006/0011897 A1 | 1/2006 | Hsu |
| 2006/0017488 A1 | 1/2006 | Hsu |
| 2006/0018149 A1 | 1/2006 | Rinerson et al. |
| 2006/0023495 A1 | 2/2006 | Rinerson |
| 2006/0023497 A1 | 2/2006 | Kawazoe |
| 2006/0028864 A1 | 2/2006 | Rinerson |
| 2006/0035451 A1 | 2/2006 | Hsu |
| 2006/0067104 A1 | 3/2006 | Hsu |
| 2006/0068099 A1 | 3/2006 | Li |
| 2006/0083055 A1 | 4/2006 | Rinerson |
| 2006/0088974 A1 | 4/2006 | Zhuang |
| 2006/0094187 A1 | 5/2006 | Hsu et al. |
| 2006/0099724 A1 | 5/2006 | Hsu |
| 2006/0099813 A1 | 5/2006 | Pan |
| 2006/0102943 A1 | 5/2006 | Ohnishi |
| 2006/0154417 A1 | 7/2006 | Shinmura |
| 2006/0160304 A1 | 7/2006 | Hsu et al. |
| 2006/0171200 A1 | 8/2006 | Rinerson |
| 2006/0194403 A1 | 8/2006 | Li |
| 2006/0220724 A1 | 10/2006 | Teng Hsu |
| 2007/0026161 A1 | 2/2007 | Madocks |

FOREIGN PATENT DOCUMENTS

| | | |
|---|---|---|
| JP | 63004841 A | 1/1988 |
| JP | 03158463 | 7/1991 |
| JP | 04365858 | 12/1992 |
| JP | 06028727 | 2/1994 |
| JP | 10121237 | 5/1998 |
| JP | 11106914 | 4/1999 |

* cited by examiner

SYSTEMS AND METHODS FOR MAGNETRON DEPOSITION

BACKGROUND

FTS (Facing Target Sputtering) method is a semiconductor fabrication technique that provides high density plasma, high deposition rate at low working gas pressure to form high quality thin film. In a facing target type of sputtering apparatus, at least a pair of target planes are arranged to face each other in a vacuum vessel, and magnetic fields are generated perpendicularly to the target planes for confining plasma in the space between the facing target planes. The substrate is arranged so as to be positioned at the side of the space so that films are produced on the substrate by sputtering.

As discussed in U.S. Pat. No. 6,156,172, a typical FTS apparatus includes a vacuum vessel for defining therein a confined vacuum chamber, an air exhausting unit having a vacuum pump system to cause a vacuum via an outlet, and a gas supplying unit for introducing sputtering gas into the vacuum vessel. A pair of target portions are arranged in the vacuum vessel in such a manner that a pair of rectangular shape cathode targets face each other so as to define a predetermined space therebetween.

Another FTS apparatus discussed in the '172 patent confines sputtering plasma in a box type of plasma space using a pair permanent magnets so as to face N and S-pole generate magnetic flux circulating perpendicularly the outside space of the first facing targets which defines facing target mode in combination with electric fields perpendicular to target planes in plasma space. The pair of magnets generate a conventional magnetron mode with a closed magnetic flux from the pole of magnets in the vicinity of the outside area of the pair of target planes in addition to the facing target mode. The cathodes of all the targets are arranged so as to recoil and confine the electrons into the plasma space by the aid of both the facing target mode and the magnetron mode.

To improve the deposition speed of the equipment, the '172 patent discloses an FTS apparatus which includes: an arrangement for defining box-type plasma units supplied therein with sputtering gas mounted on outside wall-plates of a closed vacuum vessel; at least a pair of targets arranged to be spaced apart from and face one another within the box-type plasma unit, with each of the targets having a sputtering surface thereof; a framework for holding five planes of the targets or a pair of facing targets and three plate-like members providing the box-type plasma unit so as to define a predetermined space apart from the pair of facing targets and the plate-like members, which framework is capable of being removably mounted on the outside walls of the vacuum vessel with vacuum seals; a holder for the target having conduits for a coolant; an electric power source for the targets to cause sputtering from the surfaces of the targets; permanent magnets arranged around each of the pair of targets for generating at least a perpendicular magnetic field extending in a direction perpendicular to the sputtering surfaces of the facing targets; devices for containing the permanent magnets with target holders, removably mounted on the framework; and a substrate holder at a position adjacent the outlet space of the sputtering plasma unit in the vacuum vessel.

On a parallel note, manufacturing complex metal oxide targets is a complex process involving multiple sintering, grinding and annealing steps. These steps are difficult even with simple geometries like parallelopipedal plates and strips, but become much more problematic with curved geometries and cylindrical targets. The current process requires a specialized press which costs about $50 k for each shape. Since many different shapes are typically necessary to optimize the magnetron design, and since the optimum shape is typically curved to minimize electrical fields and maximize throughput and cooling flow, the cost of making large magnetrons is often prohibitive, thus leaving the designer with sub-optimal shapes.

SUMMARY

Systems and methods are disclosed for face target sputtering to fabricate semiconductors by providing one or more materials with differential coefficients of expansion in the FTS chamber; and generating a controlled pressure and size with the one or more materials during sintering.

In one embodiment, the system uses differential coefficient of expansion of materials to achieve the necessary controlled pressure and size during the sintering step. By changing the size of the inner pressure ring with temperature while the outer casing is kept at constant shape (a low expansion alloy), a large force can be exerted on the sintered material. This force and temperature compact the material and create a solid out of the sinter powder.

In another embodiment, the FTS has an air-tight chamber in which an inert gas is admittable and exhaustible; a first cylindrical target plate; inner and outer cylindrical magnets respectively disposed adjacent to the cylindrical target plate such that magnet poles of different polarities face each other across said plasma region thereby to establish a magnetic field covering the target plate; and a substrate holder adapted to hold a substrate on which an alloyed thin film is to be deposited.

Advantages of the above system may include one or more of the following. The system allows multiple shapes of a complex-metal oxide magnetron to be used at a low cost. For example, in one embodiment, the system provides approximately 10× lower cost than conventional systems.

The above configuration provides symmetry and scalability. While conventional FTS systems is constrained in size because the magnetic field and process pressure change depending on the distance between the plates, the above circular system can be expanded since the distance between the two circular target plates can be kept constant while both of their diameters are increased. For example, while a conventional FTS system could uniformly cover only a one-inch area with a four-inch target plate separation, the circular system can cover a 12-inch area with the same four-inch target plate separation. Such increased coverage increases the deposition rate to increase productivity and thus lowers operating cost. The compact and simplified configuration also increases reliability.

BRIEF DESCRIPTION OF THE FIGURES

In order that the manner in which the above-recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which.

DESCRIPTION

Figure 1A:
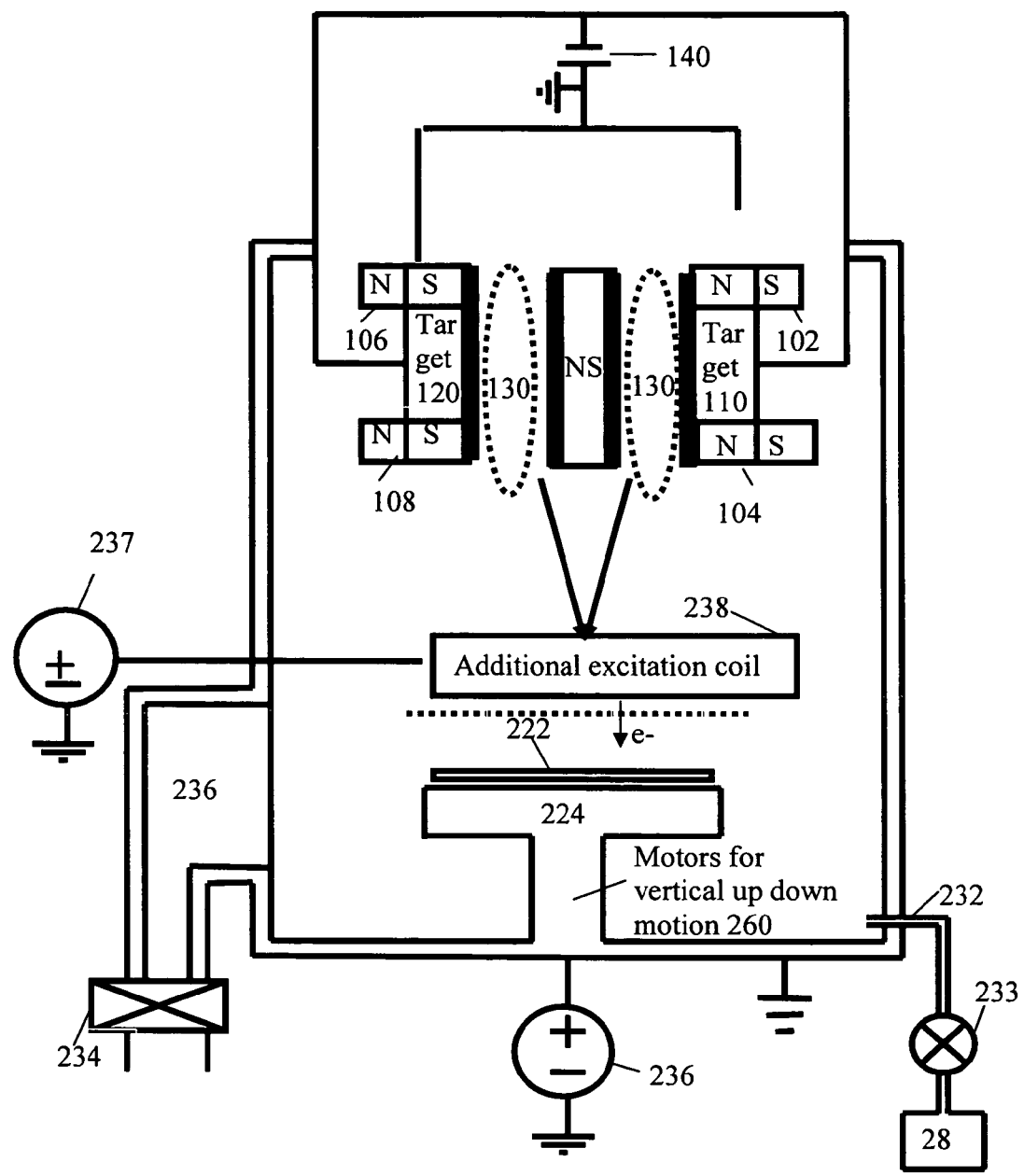
FIG. 1A shows one embodiment of an apparatus for fabricating semiconductor.

Referring now to the drawings in greater detail, there is illustrated therein structure diagrams for a semiconductor processing system and logic flow diagrams for processes a system will utilize to deposit a memory device at low temperature, as will be more readily understood from a study of the diagrams.

FIG. 1A shows one embodiment of a reactor 10. The reactor 10 includes a metal chamber 14 that is electrically grounded. A wafer or substrate 22 to be sputter coated is supported on a pedestal electrode 24 in opposition to the target 16. An electrical bias source 26 is connected to the pedestal electrode 24. Preferably, the bias source 26 is an RF bias source coupled to the pedestal electrode 24 through an isolation capacitor. Such bias source produces a negative DC self-bias VB on the pedestal electrode 24 on the order of tens of volts. A working gas such as argon is supplied from a gas source 28 through a mass flow controller 30 and thence through a gas inlet 32 into the chamber. A vacuum pump system 34 pumps the chamber through a pumping port 36.

The FTS unit is positioned to face the wafer 22 and has a plurality of magnets 102, 104, 106, and 108 which are part of two facing magnetrons. A first target 110 is positioned between magnets 102 and 104, while a second target 120 is positioned between magnets 106 and 108. The first and second targets 110 and 120 define an electron confining region 130.

Figure 1B:
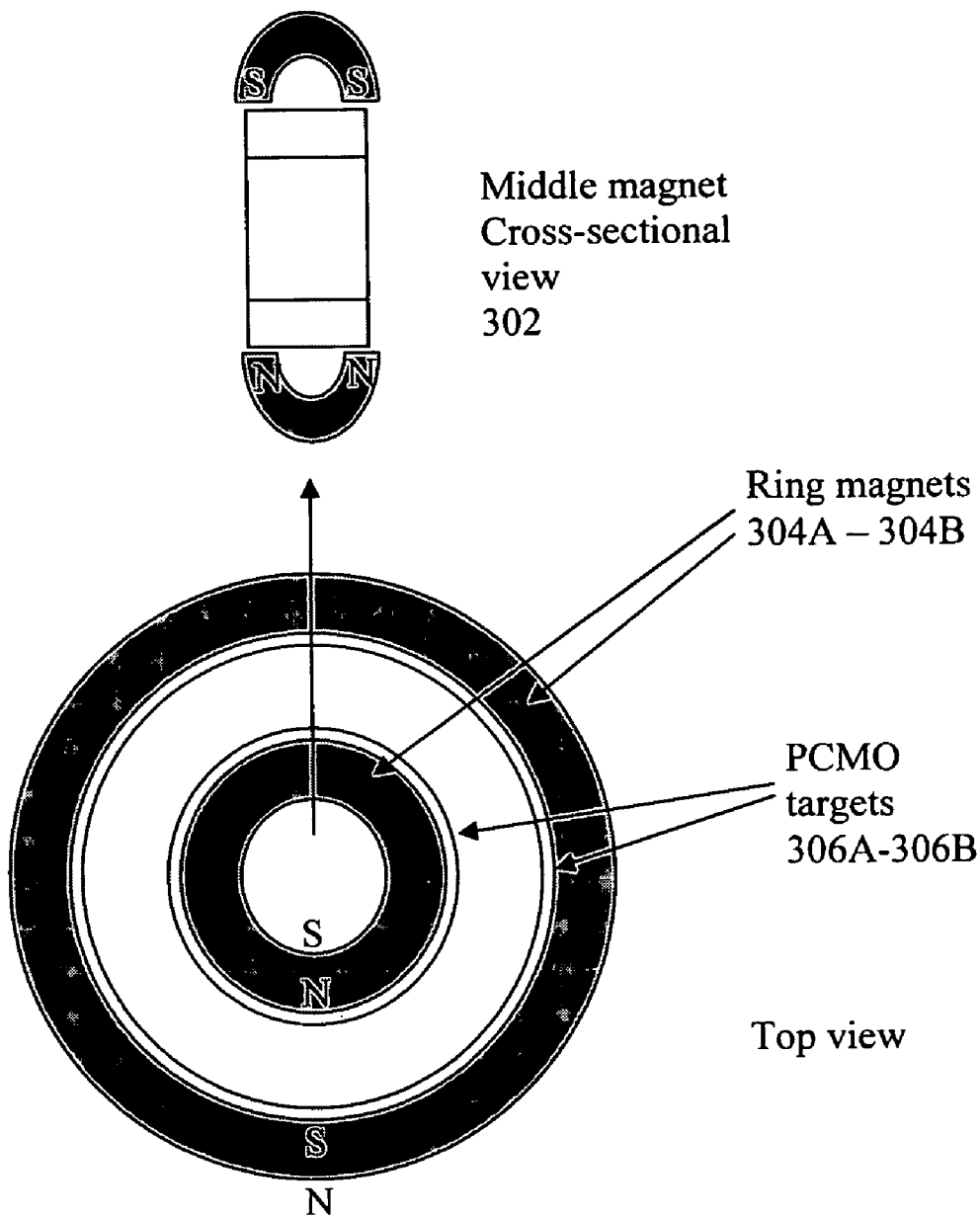
FIG. 1B shows magnet arrangement in FIG. 1A to provide a symmetrical source.
Figure 1C:
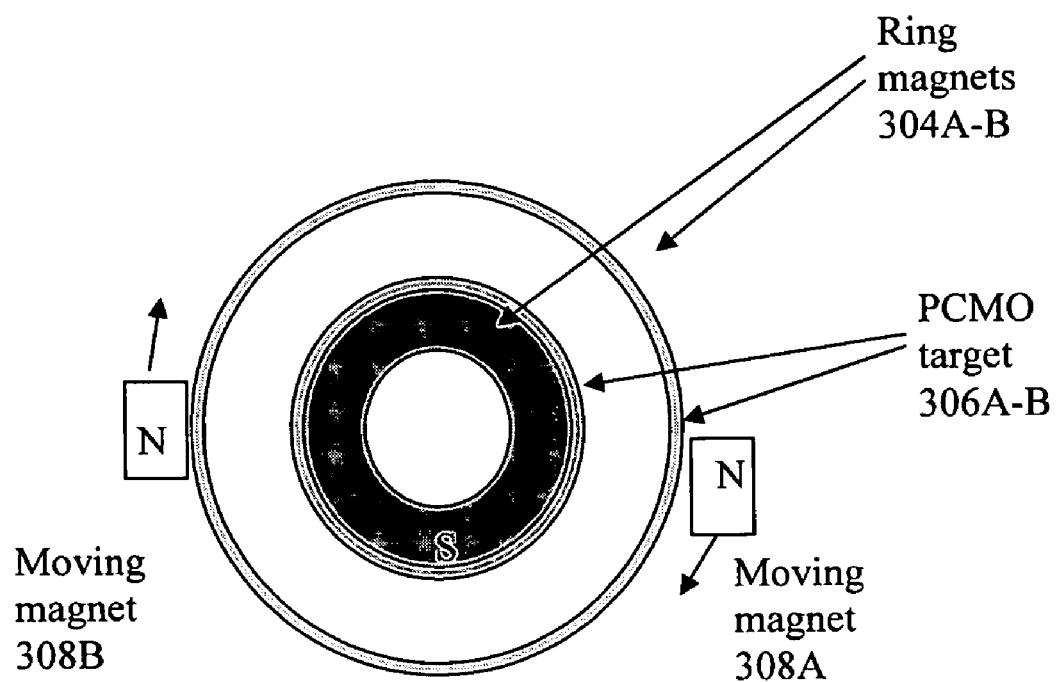
FIG. 1C shows the system of FIG. 1B with a plurality of moving magnets.

The two facing magnetrons are elongated resulting in a rectangular configuration. The rectangular configuration is bent into a doughnut shape by uniting the two ends. Thus the system has two bands of facing magnetrons, one inside the other, as shown in FIG. 1B. By adding magnets of opposite polarity behind the outer and inner target bands, a barrel shaped magnetic field is developed. Thus, on a local scale, the magnetic field is identical to the conventional FTS configuration. The pressure and electric field are identical as well.

A power supply 140 is connected to the magnets 102-108 and targets 110-120 so that positive charges are attracted to the second target 120. During operation, particles are sputtered onto a substrate 150 which, in one embodiment where the targets 110 and 120 are laterally positioned, is vertically positioned relative to the lateral targets 110 and 120. The substrate 150 is arranged to be perpendicular to the planes of the targets 110 and 120. A substrate holder 152 supports the substrate 150.

The targets 110 and 120 are positioned in the reactor 10 to define the plasma confining region 130 therebetween. Magnetic fields are then generated to cover vertically the outside of the space between facing target planes by the arrangement of magnets installed in touch with the backside planes of facing targets 110 and 120. The facing targets 110 and 120 are used a cathode, and the shield plates are used as an anode, and the cathode/anode are connected to output terminals of the direct current (DC) power supply 140. The vacuum vessel and the shield plates are also connected to the anode.

Under pressure, sputtering plasma is formed in the space 130 between the facing targets 110 and 120 while power from the power source is applied. Since magnetic fields are generated around the peripheral area extending in a direction perpendicular to the surfaces of facing targets 110 and 120, highly energized electrons sputtered from surfaces of the facing targets 110 and 120 are confined in the space between facing targets 110 and 120 to cause increased ionized gases by collision in the space 130. The ionization rate of the sputtering gases corresponds to the deposition rate of thin films on the substrate 22, then, high rate deposition is realized due to the confinement of electrons in the space 130 between the facing targets. The substrate 22 is arranged so as to be isolated from the plasma space between the facing targets 110 and 120.

Film deposition on the substrate 22 is processed at a low temperature range due to a very small number of impingement of plasma from the plasma space and small amount of thermal radiation from the target planes. A typical facing target type of sputtering method has superior properties of depositing ferromagnetic materials at high rate deposition and low substrate temperature in comparison with a magnetron sputtering method. When sufficient target voltage VT is applied, plasma is excited from the argon. The chamber enclosure is grounded. The RF power supply 26 to the chuck or pedestal 24 causes an effective DC 'back-bias' between the wafer and the chamber. This bias is negative, so it repels the low-velocity electrons.

The efficiency of the facing magnetron deposition can be further increased by incorporating a secondary additional magnetron excitation system (238) with a separate power supply 237 that increases the number of positive ions that are then accelerated into the wafer surface by the back bias.

FIG. 1B shows in more detail the magnetron structure that allows the configuration to be symmetrical and results in a small and uniform source. In this embodiment, an elongated central or middle magnet 302 is encircled by an inner ring magnet 304A. An inner target ring 306A encircles the ring magnet 304A and faces a second target ring 306B. The second target ring 306B is in turn encircled by an outer ring magnet 304B. The arrangement forms a "doughnut."

Although FIG. 1 shows a single doughnut, a plurality of doughnuts (one doughnut inside another doughnut) can be used. Thus, for a double doughnut, four magnets and four circular target plates are used. For a triple doughnut, six magnets and six circular target plates can be used. FIG. 1C shows the system of FIG. 1B with a plurality of moving magnets 308A-308B.

During operation, a parallel magnetic field having a portion parallel to the surface of the cylindrical target rings 306A-B effect generation of a magnetron-mode electromagnetic field in the vicinity of the surface over the entire periphery of each of the facing targets. Also, a magnetic field extending between the facing targets 306A-B causes facing-mode electromagnetic fields within the space between the facing targets 306A-B. As a result, high-density plasma is generated over the entire surface of each of the targets 306A-B using a small and uniform source.

Figure 1D:
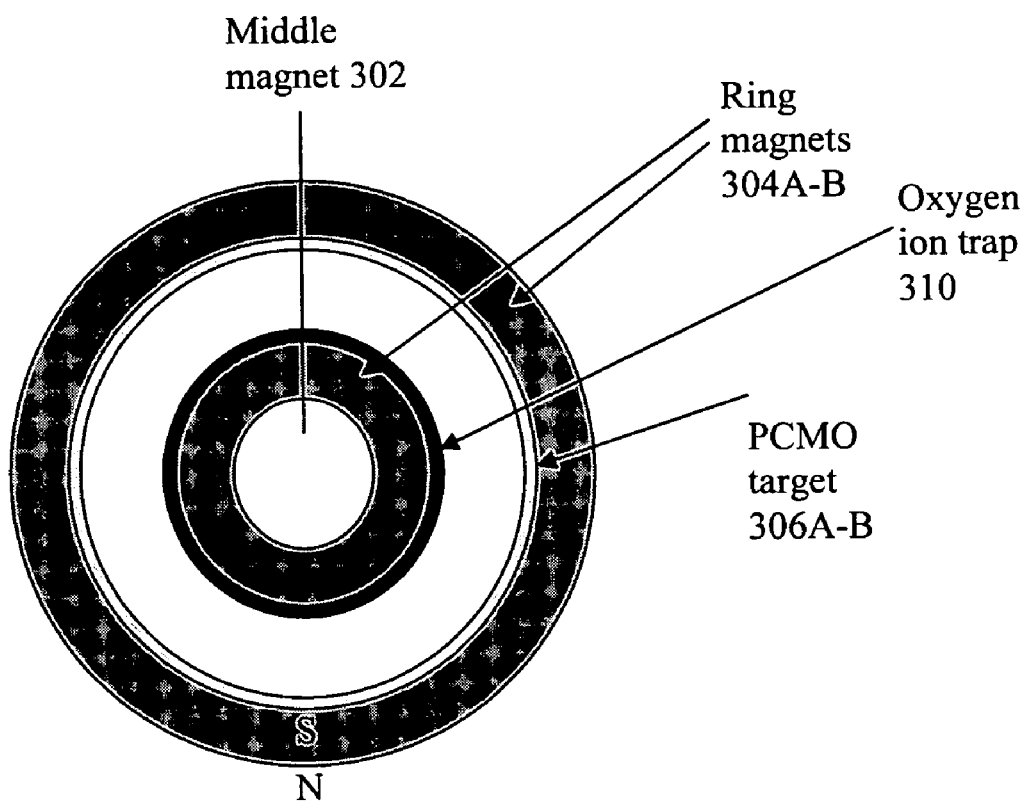
FIG. 1D shows the system of FIG. 1B with an oxygen trap.

FIG. 1D shows the system of FIG. 1B with an oxygen ion trap 310 in place of the target 306A. The oxygen ion trap 310 traps oxygen in a three-dimensional quadrupole electric field generated basically by combining an RF electric field and a DC electric field. The ion trap device is constructed by cylindrical and disc electrodes in which an ion trapping space is created around the center of the space surrounded by the electrodes. In these constructions, the electrodes are composed of a ring electrode, and two end cap electrodes placed at both ends of the ring electrodes, wherein the RF voltage is normally applied to the ring electrode. In either electrode construction, the mass to charge ratio (m/e) of an ion determines whether the ion is trapped in the trapping space in a stable manner, or whether its movement becomes unstable and it collides with the electrodes, or it is ejected from an opening of the electrodes.

Figure 1E:
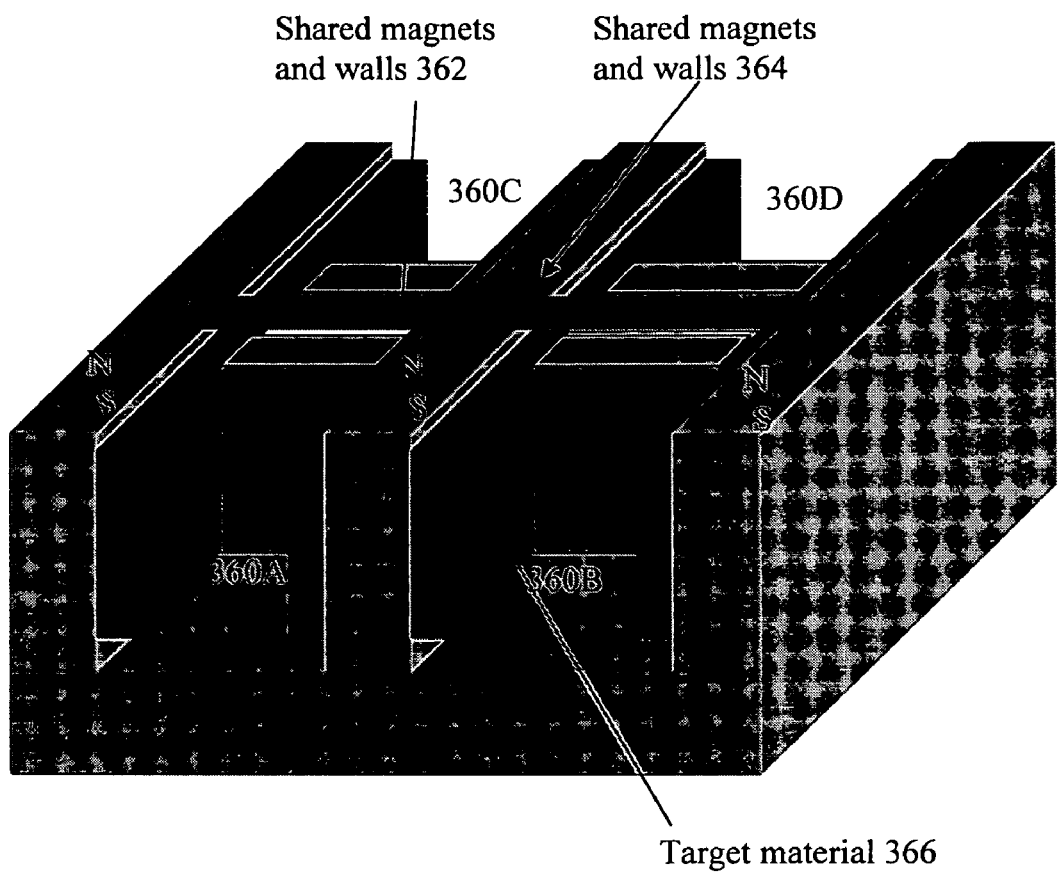
FIG. 1E shows a cross-type facing magnetron.

FIG. 1E shows a cross-type facing magnetron. In this embodiment, a plurality of square FTS source sub-chambers 360A, 360B, 360C, and 360D are positioned adjacent each other and share walls and magnets 362 and 364. The arrangement of FIG. 1E allows a four fold pattern which will increase coverage on target material 366. For example, a conventional square FTS apparatus with 4" target plate separation can cover about 2" of a 4" wafer. The shared wall arrangement of FIG. 1E can cover a larger area such as 12", for example, while increasing uniformity. Each sub-chamber yields a cosine distribution, which is additive since the chambers are in close proximity. By optimizing the exact positions, a smooth distribution will result.

Figure 1F:
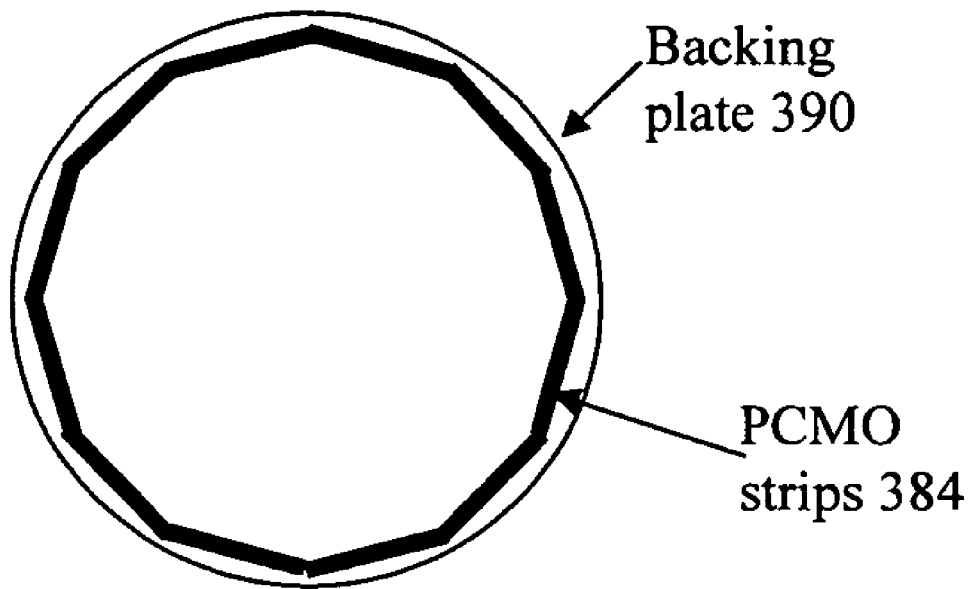
FIG. 1F shows an exemplary embodiment of a target material.

FIG. 1F shows an exemplary embodiment of a target material. The target material is typically a CMO ceramic which is difficult to shape into a circular shape. Therefore the embodiment of FIG. 1F has small rectangular CMO plates or strips 384 which will interlock to approximate a circular shape. The plates or strips 384 have backing plates 390 which is circular in shape.

Figure 2:
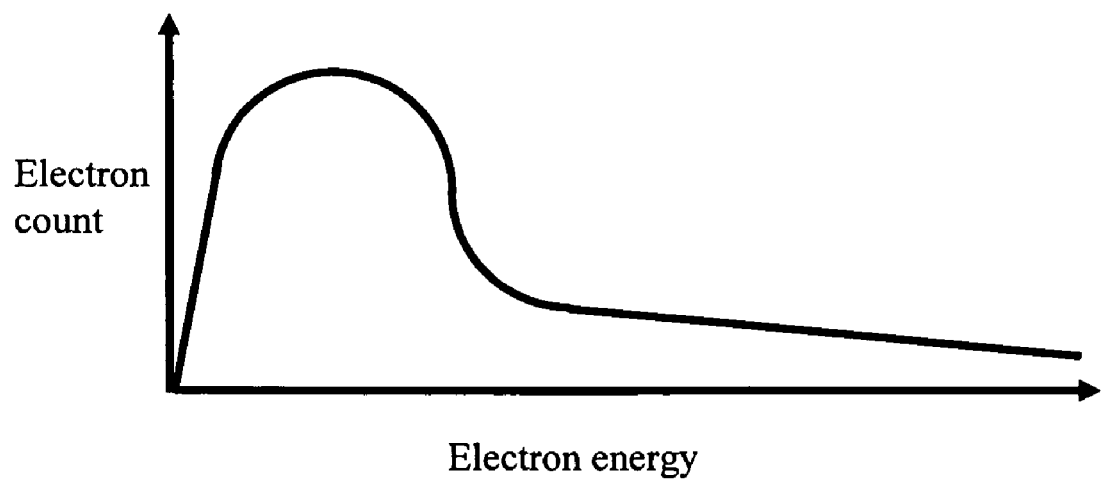
FIG. 2 is an exemplary electron distribution chart.

FIG. 2 illustrates an exemplary electron distribution for The method of FIG. 1A. The electron distribution follows a standard Maxwellian curve. Low energy electrons have two characteristics: they are numerous and they tend to have non-elastic collisions with the deposited atoms, resulting in amorphization during deposition. High-energy electrons come through the back-biased shield, but they effectively "bounce" off the atoms without significant energy transfer—these electrons do not affect the way bonds are formed. This is especially true because high energy electrons spend very little time in the vicinity of the atoms, while the low energy electrons spend more time next to the atoms and can interfere with bond formation.

The presence of the large positively biased shield affects the plasma, particularly close to the pedestal electrode 24. As a result, the DC self-bias developed on the pedestal 24, particularly by an RF bias source, may be more positive than for the conventional large grounded shield, that is, less negative since the DC self-bias is negative in typical applications. It is believed that the change in DC self-bias arises from the fact that the positively biased shield drains electrons from the plasma, thereby causing the plasma and hence the pedestal electrode to become more positive.

Figure 3:
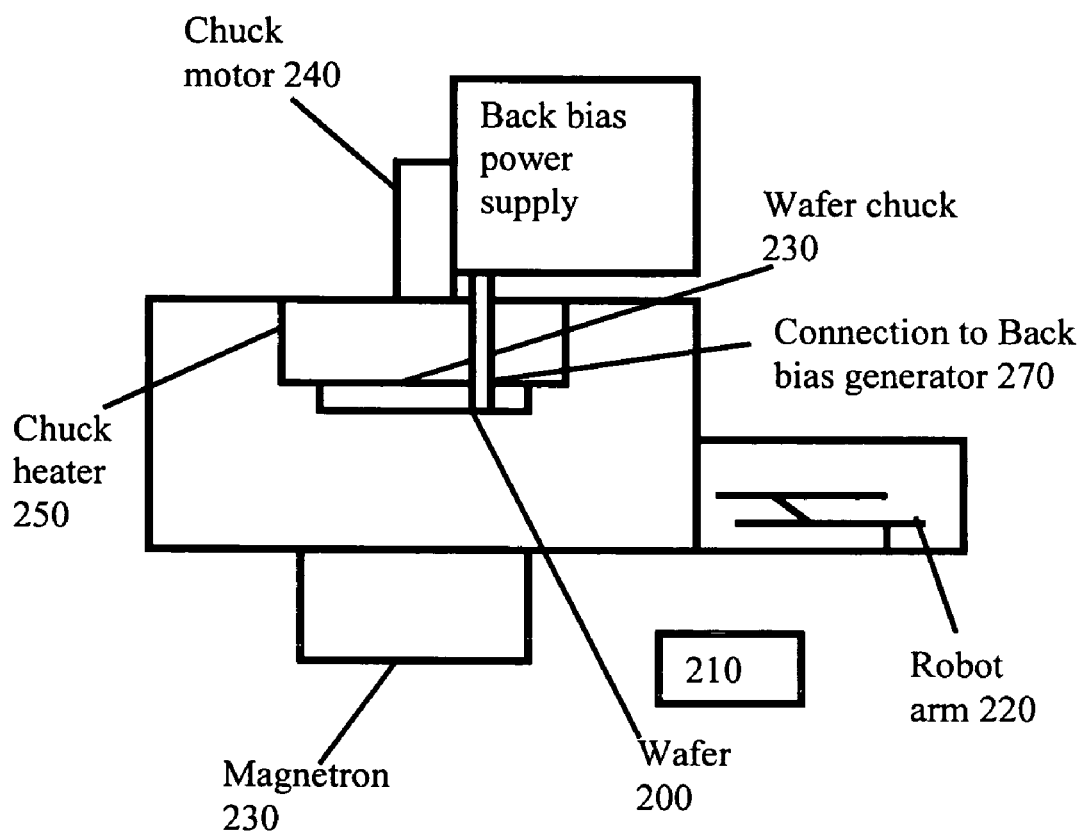
FIG. 3 shows another embodiment of a FTS unit.

FIG. 3 shows another embodiment of an FTS system. In this embodiment, a wafer 200 is positioned in a chamber 210. The wafer 200 is moved into the chamber 210 using a robot arm 220. The robot arm 220 places the wafer 200 on a wafer chuck 230. The wafer chuck 230 is moved by a chuck motor 240. One or more chuck heaters 250 heats the wafer 200 during processing.

Additionally, the wafer 200 is positioned between the heater 250 and a magnetron 260. The magnetron 260 serves as highly efficient sources of microwave energy. In one embodiment, microwave magnetrons employ a constant magnetic field to produce a rotating electron space charge. The space charge interacts with a plurality of microwave resonant cavities to generate microwave radiation. One electrical node 270 is provided to a back-bias generator such as the generator 26 of FIG. 1.

In the system of FIG. 3, two target plates are respectively connected and disposed onto two target holders which are fixed to both inner ends of the chamber 210 so as to make the target plates face each other. A pair of permanent magnets are accommodated in the target holders so as to create a magnetic field therebetween substantially perpendicular to the surface of the target plates. The wafer 200 is disposed closely to the magnetic field (which will define a plasma region) so as to preferably face it. The electrons emitted from the both target plates by applying the voltage are confined between the target plates because of the magnetic field to promote the ionization of the inert gas so as to form a plasma region. The positive ions of the inert gas existing in the plasma region are accelerated toward the target plates. The bombardment of the target plates by the accelerated particles of the inert gas and ions thereof causes atoms of the material forming the plates to be emitted. The wafer 200 on which the thin film is to be disposed is placed around the plasma region, so that the bombardment of these high energy particles and ions against the thin film plane is avoided because of effective confinement of the plasma region by the magnetic field. The back-bias RF power supply causes an effective DC 'back-bias' between the wafer 200 and the chamber 210. This bias is negative, so it repels the low-velocity electrons. By also moving the magnetron or chuck vertically with motor 260 such that the distance between them is changed during deposition, the uniformity of the magnetic field can further be increased.

The manufacturing of complex metal oxide targets involves multiple sintering, grinding and annealing steps. In several applications it is desirable to make a cylindrical target or curved geometries. To provide such non-planar geometries, one embodiment uses differential coefficient of expansion of materials to achieve a controlled pressure and size during the sintering operation.

Figure 4:
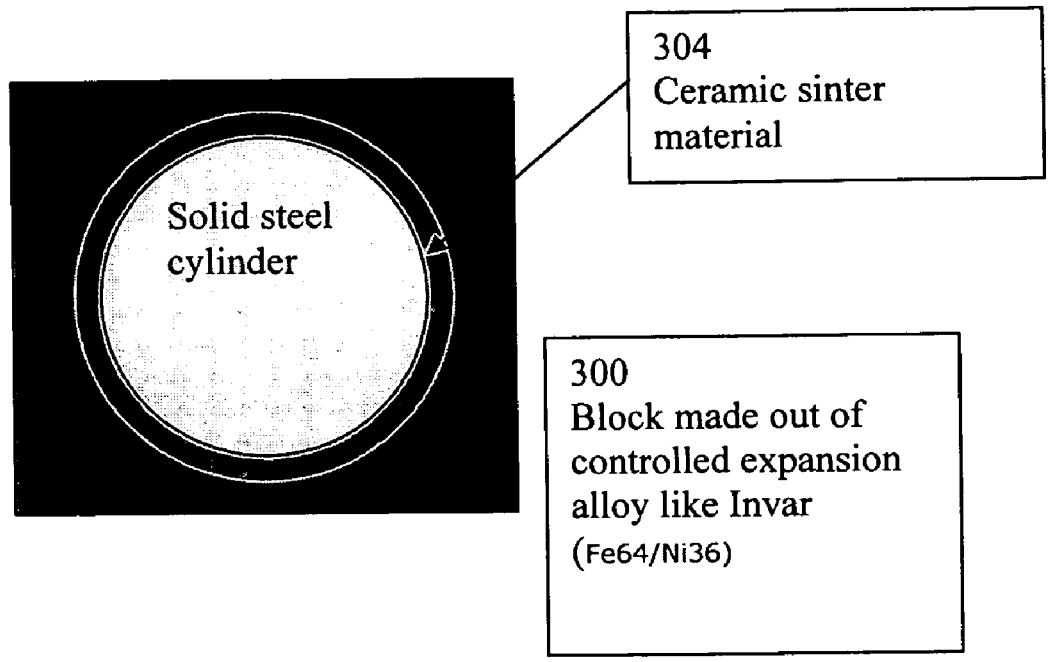
FIGS. 4-7 show exemplary embodiments of a systems using one or more materials with differential coefficients of expansion in the FTS unit to generate controlled pressure and size with the one or more materials during sintering.

FIG. 4 shows one exemplary block 300 that houses a cylinder 304. Block 300 can be made from a controlled expansion alloy such as Invar (Fe64/Ni36), among others. The cylinder 304 can be made from a ceramic sinter material, for example. The size of the cylinder 304 can be varied with temperature, while the outer casing such as the block 300 is kept at constant shape (a low expansion alloy), a large force can be exerted on the sintered material. This force and temperature compact the material and create a solid from the sinter powder.

In one exemplary configuration, the diameter of the cylinder 304 will change about 18*900×10 e-6 or 2%. For a 12" diameter target, the change in diameter will be about 6 mm. Since the desired cylinder thickness is about 3 mm, the starting thickness can be 6 mm on both sides and this will be reduced to the desired 3 mm after the sintering.

The sintering temperature can be precisely adjusted to give the best material properties while also giving the correct thickness the linear expansion of a heated solid or liquid can be measured by a quantity α, the coefficient of linear expansion as follows:

$$\alpha \equiv \frac{\Delta L/L_o}{\Delta T}$$

$$\Delta L = L_o \alpha \Delta T$$

$$L = L_o(1 + \alpha \Delta T)$$

α=Coefficient of linear expansion (SI: 1/° C.)
ΔL=Change in length (SI: m)
ΔT=Change in Temperature (SI: ° C.)

Figure 5:
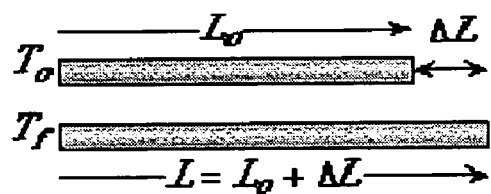
Figure 6:
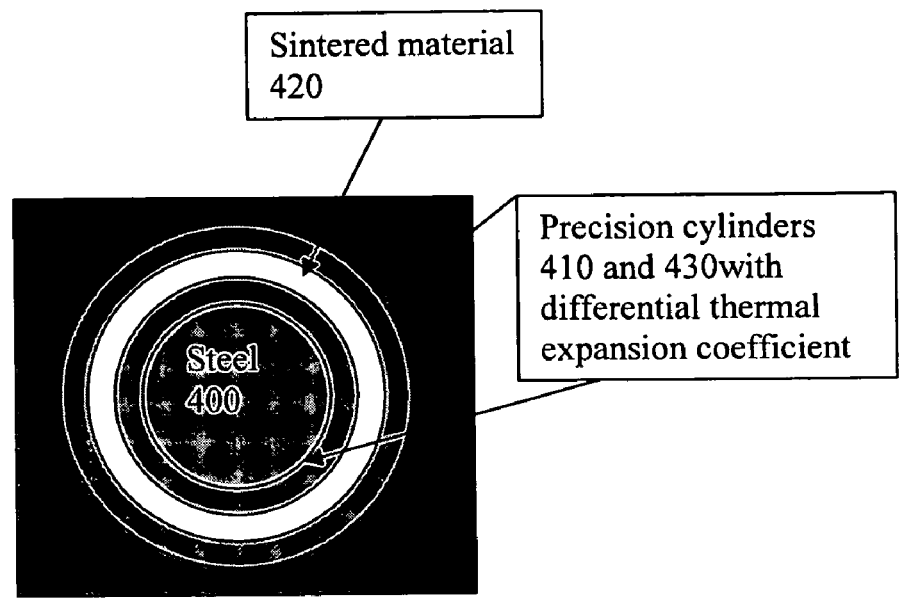

This coefficient is defined in such a way that it measures the percentage change in the length per degree temperature change as shown in FIG. 5. Exemplary coefficients of thermal expansion for various materials are shown below:

Coefficients of Thermal Expansion at 20° C.

| Substance | Linear Coefficient $\alpha$ (1/° C.) | Volumetric Coeff. $\beta = 3\alpha$ (1/° C.) |
| --- | --- | --- |
| Aluminum | $24 \times 10^{-6}$ | $72 \times 10^{-6}$ |
| Brass | $19 \times 10^{-6}$ | $57 \times 10^{-6}$ |
| Copper | $17 \times 10^{-6}$ | $51 \times 10^{-6}$ |
| Glass (ordinary) | $9 \times 10^{-6}$ | $27 \times 10^{-6}$ |
| Glass (Pyrex) | $3 \times 10^{-6}$ | $9 \times 10^{-6}$ |
| Iron/Steel | $12 \times 10^{-6}$ | $36 \times 10^{-6}$ |
| Lead | $29 \times 10^{-6}$ | $87 \times 10^{-6}$ |

Thermal Expansion of Volume:

$$\beta \equiv \frac{\Delta V / V_o}{\Delta T}$$

$$\begin{cases} \beta = 3\alpha & \text{(for Solids)} \\ \Delta V = \beta V_o \Delta T \\ V = V_o (1 + \beta \Delta T) \end{cases}$$

Thermal Expansion of Area:

$$\begin{cases} \Delta A = 2\alpha A_o \Delta T \\ A = A_o (1 + 2\alpha \Delta T) \end{cases}$$

Figure 7:
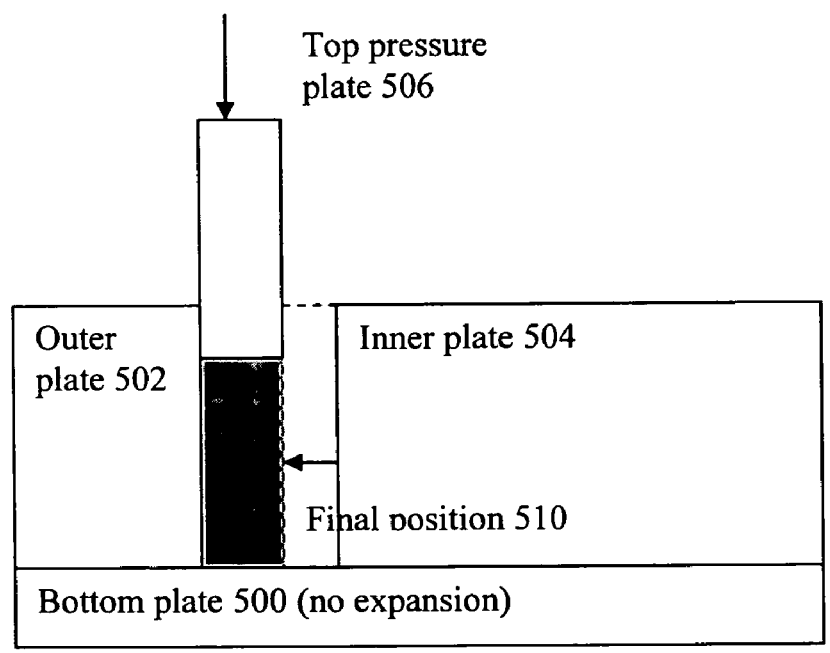

FIG. 7 shows another embodiment with a curved core 400 (such as a steel core) surrounded by precision cylinders 410 and 430 with differential thermal expansion coefficients. A sintered material 420 is positioned between the cylinders 410 and 430. This embodiment provides plates 410 and 430 with different materials having different thermal expansion constants, the same relative thickness change can be obtained regardless of diameter. An advantage of this embodiment is that the hardware can be easily reused for different sizes of the target.

The method can be used to make shapes other than cylinders as well. As such, the shapes most optimized for a particular magnetron target can be manufactured. In yet another embodiment, a compaction of the material from the top can be used to achieve a uniform sintered compound. As shown in FIG. 8, a bottom plate 500 remains fixed in position. Above the bottom plate 500, an outer plate 502 and an inner plate 504 flanks the sintered material. A top pressure plate 506 is provided to adjust the final position 510 of the sintered material.

It is to be understood that various terms employed in the description herein are interchangeable. Accordingly, the above description of the invention is illustrative and not limiting. Further modifications will be apparent to one of ordinary skill in the art in light of this disclosure.

The invention has been described in terms of specific examples which are illustrative only and are not to be construed as limiting. The invention may be implemented in digital electronic circuitry or in computer hardware, firmware, software, or in combinations of them.

Apparatus of the invention for controlling the fabrication equipment may be implemented in a computer program product tangibly embodied in a machine-readable storage device for execution by a computer processor; and method steps of the invention may be performed by a computer processor executing a program to perform functions of the invention by operating on input data and generating output. Suitable processors include, by way of example, both general and special purpose microprocessors. Storage devices suitable for tangibly embodying computer program instructions include all forms of non-volatile memory including, but not limited to: semiconductor memory devices such as EPROM, EEPROM, and flash devices; magnetic disks (fixed, floppy, and removable); other magnetic media such as tape; optical media such as CD-ROM disks; and magneto-optic devices. Any of the foregoing may be supplemented by, or incorporated in, specially-designed application-specific integrated circuits (ASICs) or suitably programmed field programmable gate arrays (FPGAs).

While the preferred forms of the invention have been shown in the drawings and described herein, the invention should not be construed as limited to the specific forms shown and described since variations of the preferred forms will be apparent to those skilled in the art. Thus the scope of the invention is defined by the following claims and their equivalents.

What is claimed is:

1. A method for forming a non-planar complex metal oxide (CMO) target in a face target sputtering (FTS) chamber, comprising:
    providing one or more materials with differential coefficients of expansion in the FTS chamber, the materials forming two precision cylinders that are concentric to each other and have different coefficients of thermal expansion;
    providing complex metal oxide between the two precision cylinders;
    generating a controlled pressure and size with the one or more materials during sintering of the complex metal oxide in the FTS chamber; and thus forming the non-planar complex metal oxide target;
    wherein the FTS sputtering chamber includes:
        an air-tight chamber in which an inert gas is admittable and exhaustible;
        a facing magnetron; and
        a substrate holder adapted to hold a substrate on which a thin film is to be deposited.

2. The method of claim 1, further comprising providing an inner pressure ring within an outer casing wherein the inner pressure ring is surrounded by two precision cylinders that are concentric to each other and have different coefficients of thermal expansion.

3. The method of claim 2, wherein the outer casing comprises a low expansion alloy.

4. The method of claim 2, comprising changing the size of the inner pressure ring with temperature while the outer casing is kept at constant shape.

5. The method of claim 2, comprising exerting force on a sintered powder of complex metal oxide.

6. The method of claim 5, wherein the force and temperature compact the sintered powder and create a solid.

7. The method of claim 2, wherein the facing magnetron further comprises inner and outer cylindrical magnets respectively disposed adjacent to the target such that magnetic poles of different polarities face each other across a plasma region thereby to establish a magnetic field.

8. The method of claim 1, wherein the target is one of: a cross-shaped target and a circular target.

9. The method of claim 1, further comprising providing one or more strips which interlocks to approximate a circular shape.

10. The method of claim 9, wherein the strips have a backing plate for cooling and electrode attachment.

11. The method of claim 1, wherein the facing magnetron comprises four source sub-chambers adjacent to each other comprise shared walls and shared magnets within the air-tight chamber in a cross-type configuration.

12. The method of claim 11, wherein the four source sub-chambers yield a four-fold pattern which uniformly increases deposition coverage on a target substrate, and each sub-chamber yields a cosine distribution which is additive since the chambers are close in proximity.

13. The method of claim 11, wherein the facing magnetron further comprises inner and outer cylindrical magnets respectively disposed adjacent to the sub-chambers such that magnetic poles of different polarities face each other across a plasma region thereby to establish a magnetic field generated from the four source sub-chambers.

14. A method of deposition, comprising:
providing a face target sputtering system, the system comprising a face target sputtering chamber, and the face target sputtering chamber comprising;
an air-tight chamber in which an inert gas is admittable and exhaustible;
a facing magnetron; and
a substrate holder adapted to hold a substrate on which a film is to be deposited;
forming a non-planar complex metal oxide target, the target formed in the face target sputtering chamber by:
providing one or more materials with differential coefficients of expansion in the FTS chamber, the materials forming two precision cylinders that are concentric to each other and have different coefficients of thermal expansion;
providing complex metal oxide between the two precision cylinders; and
generating a controlled pressure and size with the one or more materials during sintering of the complex metal oxide in the FTS chamber; and
sputtering the non-planar complex metal oxide target, thus depositing metal oxide on the substrate.

15. The method of claim 14, wherein the complex metal oxide is Praseodymium Calcium Manganese Oxide (PCMO).

16. The method of claim 14, further comprising depositing a metal on the substrate.

17. The method of claim 14, further comprising forming a barrel-shaped magnetic field in the facing magnetron.

18. The method of claim 14, further comprising placing the target at an oblique angle to the substrate holder.

19. The method of claim 14, further comprising providing an additional electron-ion magnetron excitation coil to increase the number of positive ions depositing on the substrate.

* * * * *